United States Patent
Kabutoya

(10) Patent No.: US 11,393,933 B2
(45) Date of Patent: Jul. 19, 2022

(54) SEMICONDUCTOR DEVICE AND ELECTRIC DEVICE

(71) Applicant: KYOCERA Corporation, Kyoto (JP)

(72) Inventor: Shingo Kabutoya, Tsukuba (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/253,970

(22) PCT Filed: Jun. 26, 2019

(86) PCT No.: PCT/JP2019/025296
§ 371 (c)(1),
(2) Date: Dec. 18, 2020

(87) PCT Pub. No.: WO2020/004437
PCT Pub. Date: Jan. 2, 2020

(65) Prior Publication Data
US 2021/0265511 A1 Aug. 26, 2021

(30) Foreign Application Priority Data
Jun. 29, 2018 (JP) .............................. JP2018-124659

(51) Int. Cl.
*H01L 29/47* (2006.01)
*H01L 29/06* (2006.01)
(Continued)

(52) U.S. Cl.
CPC ...... *H01L 29/8725* (2013.01); *H01L 29/0611* (2013.01); *H01L 29/407* (2013.01); *H01L 29/47* (2013.01)

(58) Field of Classification Search
CPC ............. H01L 29/8725; H01L 29/0611; H01L 29/407; H01L 29/47; H01L 29/872
See application file for complete search history.

(56) References Cited

U.S. PATENT DOCUMENTS 10,784,338 B2 * 9/2020 Cheng ................ H01L 29/1095
2008/0164520 A1 * 7/2008 Darwish ............. H01L 21/2658
257/334

(Continued)

FOREIGN PATENT DOCUMENTS

JP 2003-522413 A 7/2003
JP 2015-153769 A 8/2015

OTHER PUBLICATIONS

Mudholkar et al., "Trench Schottky Rectifiers with Non-Uniform Trench Depths," 2017 29th International Symposium on Power Semiconductor Devices and IC's (ISPSD), pp. 81-84 (2017).

(Continued)

*Primary Examiner* — Shahed Ahmed
*Assistant Examiner* — Khatib A Rahman
(74) *Attorney, Agent, or Firm* — Volpe Koenig

(57) ABSTRACT

A semiconductor device includes first and second layers and first and second electrodes. The first layer has a first semiconductor containing an impurity of a first conductivity type. The second layer is in contact with the first layer and has a second semiconductor containing the impurity at a lower concentration than the first semiconductor. The first electrode is in contact with a first surface of the first layer. The second electrode is in contact with a second surface of the second layer. The second layer further has first and second trenches. The first trench has therein a third electrode connected to the second electrode. The second trench is located closer to an outer perimeter portion of the second layer than the first trench and has therein a fourth electrode connected to the second electrode. An entire outer perimeter end of the second electrode is in contact with the fourth electrode.

12 Claims, 3 Drawing Sheets

(51) Int. Cl.
*H01L 29/40* (2006.01)
*H01L 29/872* (2006.01)

(56) References Cited

U.S. PATENT DOCUMENTS

| | | | | |
|---|---|---|---|---|
| 2009/0206924 | A1* | 8/2009 | Zeng | H01L 29/407 257/330 |
| 2009/0236611 | A1* | 9/2009 | Yamamoto | H01L 29/872 257/77 |
| 2009/0261350 | A1* | 10/2009 | Yamamoto | H01L 29/7397 257/77 |
| 2010/0059814 | A1* | 3/2010 | Loechelt | H01L 29/66727 438/270 |
| 2011/0298044 | A1* | 12/2011 | Yagi | H01L 29/66734 257/330 |
| 2015/0228809 | A1* | 8/2015 | Sugiura | H01L 29/872 257/485 |
| 2016/0240614 | A1* | 8/2016 | Okuhata | H01L 29/407 |
| 2017/0148785 | A1* | 5/2017 | Hirabayashi | H01L 27/0635 |
| 2017/0222038 | A1* | 8/2017 | Katou | H01L 29/42376 |
| 2017/0271437 | A1* | 9/2017 | Kono | H01L 29/1095 |
| 2018/0019348 | A1* | 1/2018 | Yu | H01L 21/265 |
| 2018/0269315 | A1* | 9/2018 | Kato | H01L 29/0619 |
| 2021/0305435 | A1* | 9/2021 | Hori | H01L 29/872 |

OTHER PUBLICATIONS

Shimizu et al., "100V Trench MOS Barrier Schottky Rectifier Using Thick Oxide Layer (TO-TMBS)," Proceedings of the 2001 International Symposium on Power Semiconductor Devices & ICs, Osaka, pp. 243-246 (2001).

* cited by examiner

SEMICONDUCTOR DEVICE AND ELECTRIC DEVICE

TECHNICAL FIELD

The present disclosure relates to a semiconductor device and an electric device.

BACKGROUND ART

There is disclosed in Patent Literature 1, as a semiconductor device, a trenched Schottky rectifier in which a plurality of trenches is formed in a semiconductor layer. These trenches include a perimeter trench disposed close to the outer perimeter portion of the semiconductor layer and an inner trench disposed far from the outer perimeter portion of the semiconductor layer when compared with the perimeter trench.

CITATION LIST

Patent Literature

Patent Literature 1: JP 2003-522413 A

SUMMARY OF INVENTION

Solution to Problem

A semiconductor device of the present disclosure includes:
a first layer having a first semiconductor containing an impurity of a first conductivity type;
a second layer being in contact with the first layer and having a second semiconductor containing the impurity of the first conductivity type at a lower concentration than the first semiconductor;
a first electrode being in contact with a first surface of the first layer opposite the second layer; and
a second electrode being in contact with a second surface of the second layer opposite the first layer,
wherein the second layer further has:
a first trench having therein a third electrode connected to the second electrode; and
a second trench located closer to an outer perimeter portion of the second layer than the first trench and having therein a fourth electrode connected to the second electrode, and
wherein an entire outer perimeter end of the second electrode that is in contact with the second surface between the first trench and the second trench is in contact with the fourth electrode.

An electric device of the present disclosure includes a semiconductor device including:
a first layer having a first semiconductor containing an impurity of a first conductivity type;
a second layer being in contact with the first layer and having a second semiconductor containing the impurity of the first conductivity type at a lower concentration than the first semiconductor;
a first electrode being in contact with a first surface of the first layer opposite the second layer; and
a second electrode being in contact with a second surface of the second layer opposite the first layer,
wherein the second layer further has:
a first trench having therein a third electrode connected to the second electrode; and
a second trench located closer to an outer perimeter portion of the second layer than the first trench and having therein a fourth electrode connected to the second electrode, and
wherein an entire outer perimeter end of the second electrode that is in contact with the second surface between the first trench and the second trench is in contact with the fourth electrode.

DESCRIPTION OF EMBODIMENTS

Figure 1:
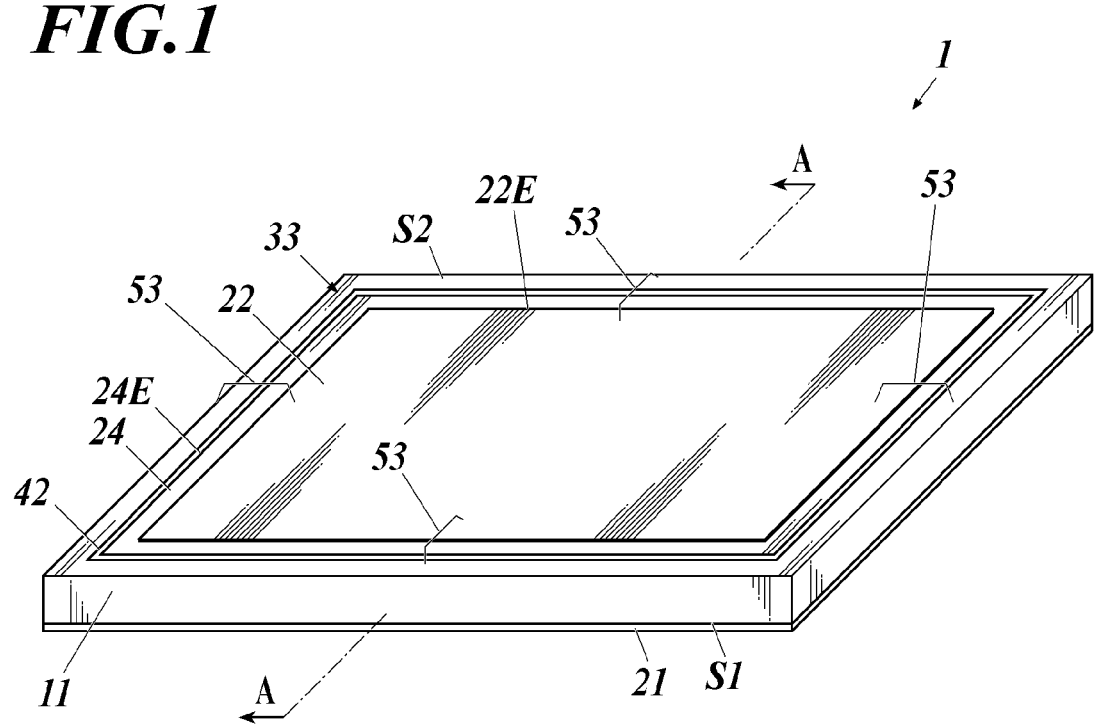
FIG. 1 is a perspective view showing a Schottky barrier diode according to an embodiment of the present disclosure.

Hereinafter, an embodiment of the present disclosure will be described in detail with reference to the drawings. However, detailed descriptions of well-known matters, duplicate matters and the like may be omitted. The drawings and the following description are for those skilled in the art to fully understand the present disclosure. Hence, the drawings and the following description are not intended to limit the subject matters set forth in the scope of claims. All the drawings are diagrammatic. Relative dimensions of parts in the drawings may be changed to be larger or smaller as appropriate.

Figure 2:
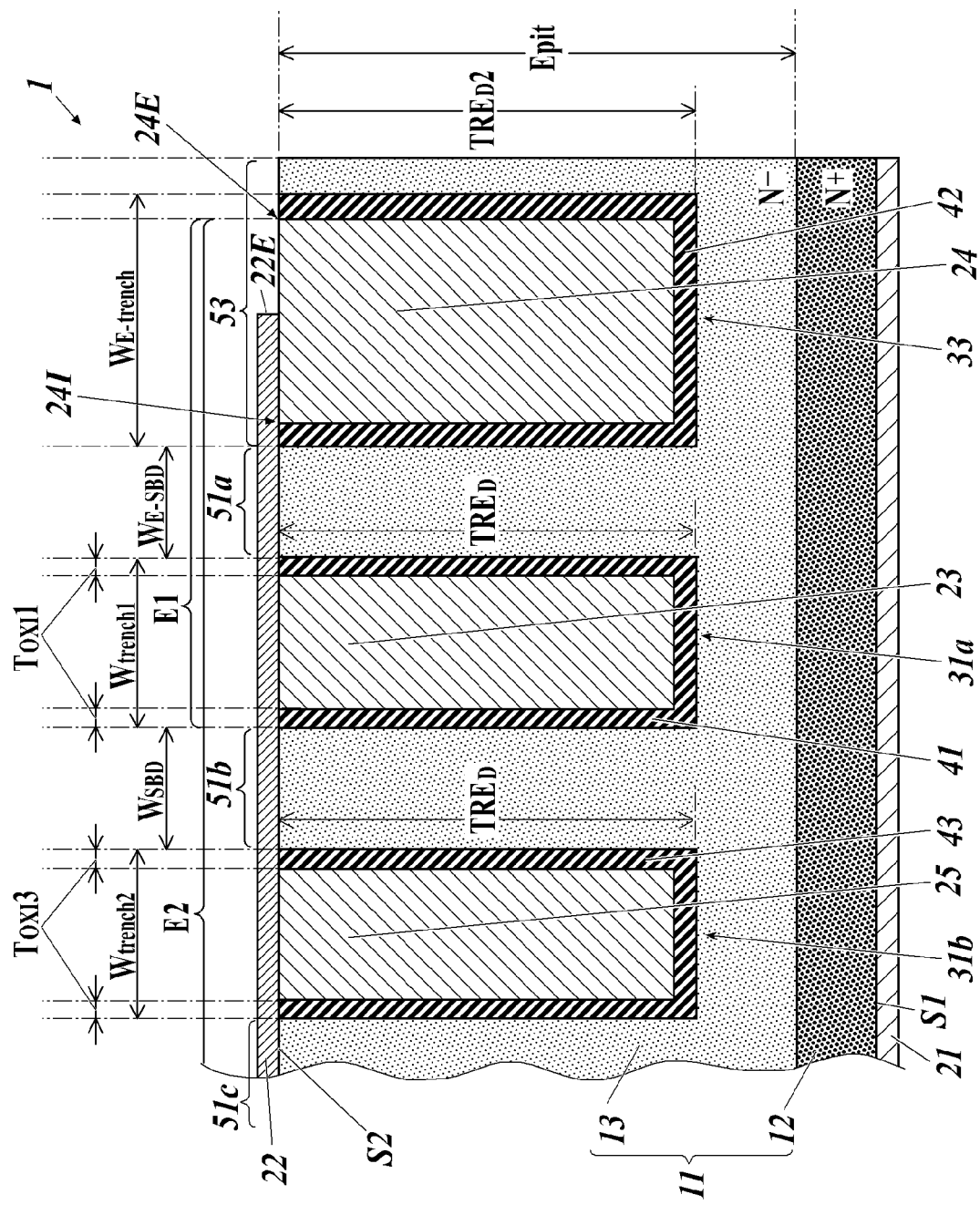
FIG. 2 shows part of a section taken along line A-A in FIG. 1.
Figure 3:
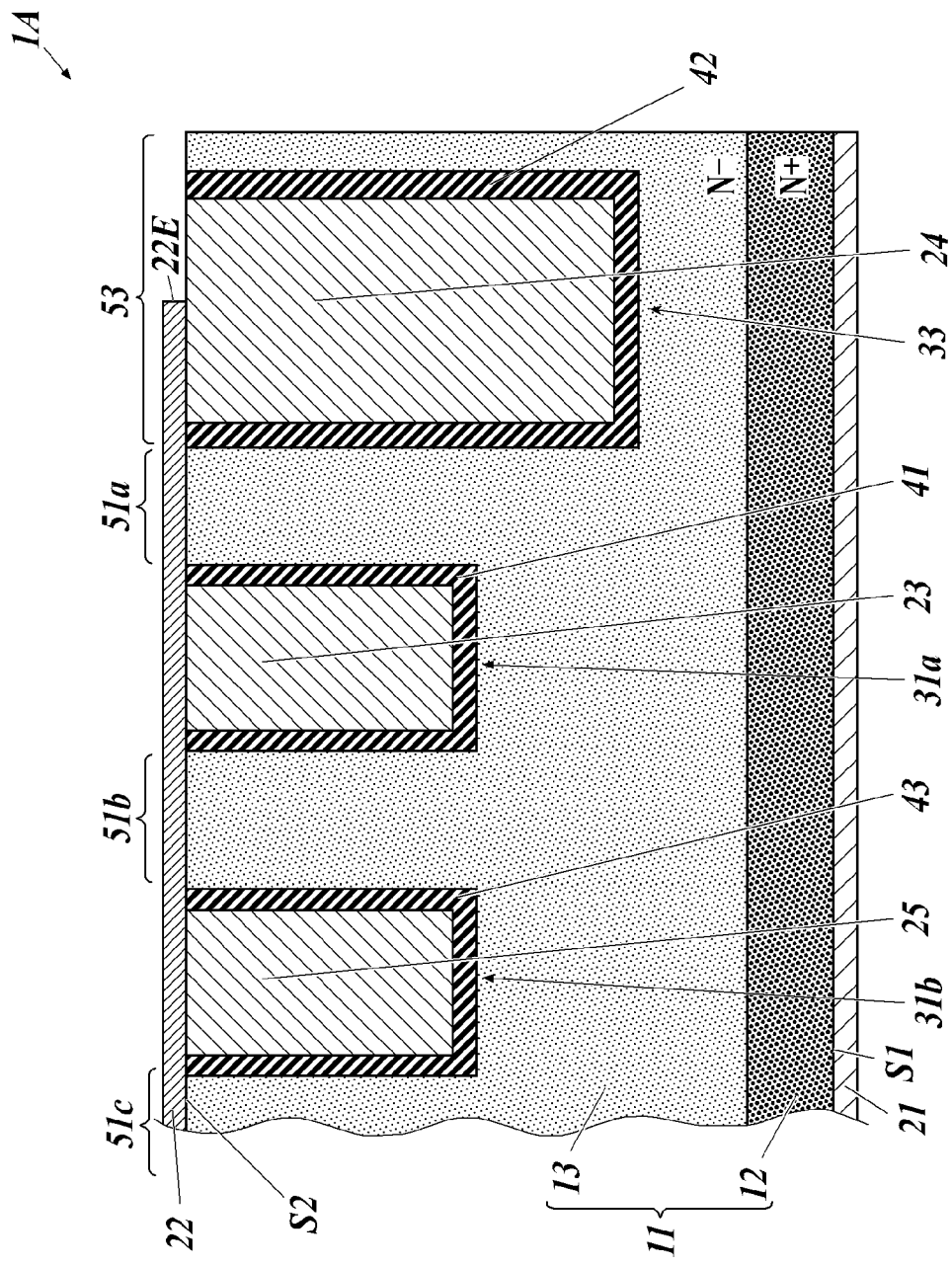
FIG. 3 is a sectional view showing a modification of the Schottky barrier diode according to the embodiment of the present disclosure.

FIG. 1 is a perspective view showing a Schottky barrier diode according to an embodiment of the present disclosure. FIG. 2 shows part of a section taken along line A-A in FIG. 1. FIG. 3 is a sectional view showing a modification of the Schottky barrier diode according to the embodiment of the present disclosure.

In this embodiment, a direction from a first electrode 21 toward a second electrode 22 may be referred to as upward or an up direction, and the opposite direction may be referred to as downward or a down direction. A Schottky barrier diode 1 according to this embodiment has a plate shape. A portion surrounding and along the edge of the plate surface of the Schottky barrier diode is referred to as an outer perimeter portion. On a vertical section of the Schottky barrier diode 1, a position closer to the outer perimeter portion may be referred to as an outer perimeter side, and a position closer to the center of the plate surface may be referred to as a center side. FIG. 2 shows the outer perimeter portion of the Schottky barrier diode 1 and the vicinity. The Schottky barrier diode 1 corresponds to an example of a semiconductor device according to the present disclosure.

As shown in FIG. 2, the Schottky barrier diode 1 according to this embodiment has a pressure-resistant area 53 located on the outer perimeter side and rectifier areas 51a, 51b, 51c located on the center side when compared with the pressure-resistant area 53.

The rectifier areas 51a, 51b, 51c are covered with the second electrode 22 from the above, and each of them is sandwiched, from the sides, between the outer surfaces of two adjacent tranches among inner trenches 31a, 31b and a perimeter trench 33. In the rectifier areas 51a, 51b, 51c, a Schottky barrier is generated at the interface between the second electrode 22 and an N⁻-type semiconductor of an epitaxial layer 13.

The pressure-resistant area 53 is an area from the perimeter trench 33 to the outer perimeter end of a semiconductor layer 11. When the reverse voltage is applied to the Schottky barrier electrode 1, the pressure-resistant area 53 relieves concentration of the biased electric field that is applied to the semiconductor layer 11 from the outer perimeter end of the second electrode 22, and improves pressure resistance of the semiconductor layer 11.

The Schottky barrier diode 1 includes the semiconductor layer 11, the first electrode 21 and the second electrode 22. The semiconductor layer 11 includes a semiconductor substrate 12 and the epitaxial layer 13. The semiconductor substrate 12 corresponds to an example of a first layer according to the present disclosure. The epitaxial layer 13 corresponds to an example of a second layer according to the present disclosure.

The semiconductor substrate 12 is a silicon substrate, and is an N-type semiconductor containing a minute amount of impurities (that corresponds to an example of a first semiconductor of a first conductivity type according to the present disclosure). The impurities may be any of arsenic (As), phosphorus (P) and antimony (Sb). The semiconductor substrate 12 may be a P-type semiconductor. When the semiconductor substrate 12 is a P-type semiconductor, the N-type semiconductor in the following description is replaced by the P-type semiconductor. When the semiconductor substrate 12 is the P-type, the impurities may be boron (B) or aluminum (Al). The semiconductor substrate 12 may be a substrate including any of various semiconductors, such as silicon carbide (SiC), gallium nitride (GaN) and gallium oxide ($Ga_2O_3$). In this embodiment, as an example, an N-type semiconductor of silicon (Si) is used as the semiconductor substrate 12. A semiconductor having a high impurity concentration may be expressed by using "+" (plus), whereas a semiconductor having a low impurity concentration may be expressed by using "−" (minus). The semiconductor substrate 12 includes an $N^+$-type semiconductor.

The epitaxial layer 13 may be formed by using any of various known techniques, such as vapor deposition, molecular-beam epitaxy, sublimation, pyrolysis, CVD (Chemical Vapor Deposition) and mist CVD (Chemical Vapor Deposition). The epitaxial layer 13 is the same as the semiconductor substrate 12 in the conductivity type and contains the impurities at a lower concentration than the semiconductor substrate 12. That is, the epitaxial layer 13 includes an $N^−$-type semiconductor (that corresponds to an example of a second semiconductor according to the present disclosure). The impurities contained in the semiconductor substrate 12 and the impurities contained in the epitaxial layer 13 may be different from one another.

The epitaxial layer 13 has a plurality of inner trenches 31a, 31b and one perimeter trench 33. One of the inner trenches, 31a, corresponds to an example of a first trench according to the present disclosure. The perimeter trench 33 corresponds to an example of a second trench according to the present disclosure. The other inner trench 31b corresponds to an example of a third trench according to the present disclosure.

A plurality of inner trenches including the two inner trenches 31a, 31b may be disposed, in a plan view of the semiconductor layer 11, so as to be striped, or so as to surround the center side of the semiconductor layer 11. The number of inner trenches 31a, 31b may be three or more, or may be one by the inner trench 31b being omitted. The inner trenches 31a, 31b extend, in FIG. 2 and FIG. 3, in the front-back direction on the plane of paper.

The perimeter trench 33 is located in the pressure-resistant area 53 so as to surround the rectifier areas 51a, 51b, 51c. In other words, the perimeter trench 33 extends along the outer perimeter portion of the semiconductor layer 11 so as to cover the entire perimeter of the semiconductor layer 11. The perimeter trench 33 extends, in FIG. 2 and FIG. 3, in the front-back direction on the place of paper, similarly to the inner trenches 31a, 31b.

The first electrode 21 is in contact with a surface of the semiconductor substrate 12 opposite the epitaxial layer 13. This surface may be referred to as a first surface S1. The first surface S1 is located, in FIG. 2, on the lower side on the plane of paper. The first electrode 21 contains a metal. The metal may be any of various metals including alloys. The first electrode 21 may be another conductor.

The second electrode 22 is in contact with a surface of the epitaxial layer 13 opposite the semiconductor substrate 12. This surface may be referred to as a second surface S2. The second surface S2 is located, in FIG. 2, on the upper side on the plane of paper. The second electrode 22 contains a metal. The metal may be any of various metals including alloys. The second electrode 22 may be another conductor.

The inner trenches 31a, 31b and the perimeter trench 33 extend in the up-down direction (i.e. thickness direction) of the epitaxial layer 13. The inner trenches 31a, 31b and the perimeter trench 33 have therein inner field electrodes 23, 25, 24, respectively, extending in the thickness direction of the epitaxial layer 13. The inner field electrode 23 in the inner trench 31a may be referred to as a third electrode. The inner field electrode 24 in the perimeter trench 33 may be referred to as a fourth electrode. The inner field electrode 25 in the inner trench 31b may be referred to as a fifth electrode. The inner field electrodes 23 to 25 may be polysilicon. The inner field electrodes 23 to 25 may be other conductors. One surface of each of the inner field electrodes 23 to 25 is exposed at the second surface S2.

The inner trenches 31a, 31b and the perimeter trench 33 further have insulating films 41 to 43, respectively, interposed between the inner field electrodes 23 to 25 and the $N^−$-type semiconductor of the epitaxial layer 13. The insulating film 41 that the inner trench 31a has may be referred to as a first insulating film. The insulating film 42 that the perimeter trench has may be referred to as a second insulating film. The insulating film 43 that the inner trench 31b has may be referred to as a third insulating film. The insulating films 41 to 43 may contain dielectrics. The inner field electrodes 23, 25 in the inner trenches 31a, 31b are capacitively coupled to the $N^−$-type semiconductor of the epitaxial layer 13 via the insulating films 41, 43, respectively. The inner field electrode 24 in the perimeter trench 33 is capacitively coupled to the $N^−$-type semiconductor of the epitaxial layer 13 via the insulating film 42.

The entire outer perimeter end 22E of the second electrode 22 is located on the exposed surface of the inner field electrode in the perimeter trench 33. In other words, on the entire perimeter of the Schottky barrier diode 1, when viewed from the above, the end (22E) of the second electrode 22 on the outer perimeter side is located in an area from an end 24E on the outer perimeter side to an end 241 on the center side of the inner field electrode 24.

The inner field electrode 24 and the insulating film 42 may protrude from the second surface S2. The inner field electrode 24 and the insulating film 42 may run on the outside of the perimeter trench 33 to extend toward the outer perimeter side of the Schottky barrier diode 1. When the inner field electrode 24 and the insulating film 42 extend outside the perimeter trench 33, the outer perimeter end 22E of the second electrode 22 may be on the protruding portion of the inner field electrode 24. Of the insulating film 42, the portion that runs on the outside of the perimeter trench 33 may be formed simultaneously with the insulating film 42 inside the perimeter trench 33.

The second electrode 22 electrically connects with the inner field electrodes 23, 25 in the inner trenches 31a, 31b. The inner field electrodes 23, 25 form an electric field relief region in an area of the N⁻-type semiconductor sandwiched between the paired inner trenches 31a, 31b. When a voltage smaller than the breakdown voltage is applied to between the first electrode 21 and the second electrode 22 in the blocking state of the Schottky barrier diode 1, the Schottky barrier in the rectifier areas 51a, 51b, 51c and the electric field relief region can be depleted. This reduces the reverse leakage current of the Schottky barrier diode 1.

The second electrode 22 also electrically connects with the inner field electrode 24 in the perimeter trench 33. This electrical connection produces the field plate effect and relieves concentration of the biased electric field on the outer perimeter portion of the semiconductor layer 11. The inner field electrode 24 in the perimeter trench 33 extends in the thickness direction of the epitaxial layer 13. Hence, the field plate effect by the perimeter trench 33 acts in the thickness direction of the epitaxial layer 13, and the peak of the electric field moves toward the bottom of the perimeter trench 33 when compared with a case where the inner field electrode 24 is not provided. The end of the inner field electrode 24 in the perimeter trench 33 on the pressure-resistant side is located at a point more forward than the end of the second electrode 22 in a direction from the rectifier areas 51a, 51b, 51c toward the pressure-resistant area 53. Hence, the peak of the electric field moves in the direction from the rectifier areas 51a, 51b, 51c toward the pressure-resistant area 53. Movement of the peak position of the electric field relieves concentration of the electric field, and hence even when the width of the pressure-resistant area 53 is made small, desired pressure resistance performance can be obtained.

The area (size) of the rectifier areas 51a to 51c cannot be made small in terms of maintaining forward characteristics (forward voltage VF, etc.) of the Schottky barrier diode 1 at a predetermined value(s). However, the width of the pressure-resistant area 53 can be made small, and hence the chip size of the Schottky barrier diode 1 can be reduced by the amount.

In this embodiment, one surface of each of the inner field electrodes 23, 24 exposed at the second surface S2 may be substantially flush with the second surface S2 of the N⁻-type semiconductor of the epitaxial layer 13. One surface of each of the insulating films 41, 42 exposed at the second surface S2 may be substantially flush with the second surface S2 of the N⁻-type semiconductor of the epitaxial layer 13. In other words, of the second surface S2, at least an area E1 from the end of the inner trench 31a on the center side to the end of the inner field electrode 24 on the outer perimeter side is flat. Of the second surface S2, an area E2 that contains all (both) the inner trenches 31a, 31b may be flat. Hence, in the area E1 or E2 of the second surface S2, a situation does not occur where part thereof protrudes upward or a step is generated. This improves step coverage in forming the second electrode 22 in the area E1 or E2.

For example, in order for an electrode to be formed from the inner surface to the bottom of a perimeter trench, a resist needs to be molded into a predetermined shape at the bottom of the perimeter trench. However, molding accuracy of the resist decreases at the bottom. Hence, the first pass yield of Schottky barrier diodes decreases. In this embodiment, processing accuracy of the second electrode 22 does not decrease, and hence the first pass yield can be improved.

The depth $TRE_D$ of the inner trench 31a/31b and the depth $TRE_D2$ of the perimeter trench 33 may be substantially the same. For example, the difference between the depth $TRE_D$ of the inner trench 31a/31b and the depth $TRE_D2$ of the perimeter trench 33 may be less than 10% of the depth $TRE_D$ of the inner trench 31a/31b. The depth direction is the thickness direction of the epitaxial layer 13. The depth $TRE_D$ of the inner trench 31a/31b is a direct distance from the second surface S2 of the epitaxial layer 13 to the point closest to the semiconductor substrate 12 on the bottom of the inner trench 31a/31b. Similarly, the depth $TRE_D2$ of the perimeter trench 33 is a direct distance from the second surface S2 of the epitaxial layer 13 to the point closest to the semiconductor substrate 12 on the bottom of the perimeter trench 33. The depth $TRE_D2$ of the perimeter trench 33 being substantially the same as the depth $TRE_D$ of the inner trench 31a/31b allows the perimeter trench 33 to be also formed in a step in which the inner trenches 31a, 31b are formed.

For example, when the depth of a perimeter trench is different from the depth of an inner trench by 10% or more, the number of steps increases because steps in which these are formed are separate, for example. In this embodiment, the inner trenches 31a, 31b and the perimeter trench 33 can be formed in the same step.

As in a Schottky barrier diode 1A of a modification shown in FIG. 3, the depth of the inner trench 31a/31b and the depth of the perimeter trench 33 may be different by 10% or more. The perimeter trench 33 being deeper than the inner trench 31a/31b can improve pressure resistance performance of the Schottky barrier diode 1A against the reverse voltage.

When $E_{pit}$ represents the thickness of the epitaxial layer 13, and $TRE_D$ represents the depth of the inner trench 31a/31b, a relationship between $E_{pit}$ and $TRE_D$ may be $0.30 \times E_{pit} \leq TRE_D \leq 0.80 \times E_{pit}$. With this relationship, the Schottky barrier diode 1 obtains desired pressure resistance.

When $E_{pit}$ represents the thickness of the epitaxial layer 13, and $TRE_D2$ represents the depth of the perimeter trench 33, a relationship between $E_{pit}$ and $TRE_D2$ may be $0.30 \times E_{pit} \leq TRE_D2 \leq 0.80 \times E_{pit}$. When the depth of the inner trench 31a/31b and the depth of the perimeter trench 33 are the same, $TRE_D = TRE_D2$. With this relationship, the Schottky barrier diode 1 obtains desired pressure resistance.

For the sake of easy explanation, the two inner trenches 31a, 31b are referred to as a first inner trench 31a and a second inner trench 31b. The second inner trench 31b is located next to the first inner trench 31a and opposite the perimeter trench 33 across it. That is, from the center side to the outer perimeter side of the second surface S2, the second inner trench 31b, the first inner trench 31a and the perimeter trench 33 line up in this order. The second inner trench 31b extends parallel to the first inner trench 31a. The insulating film 41 in the first inner trench 31a and the insulating film 43 in the second inner trench 31b may have the same thickness. When $W_{SDB}$ represents the distance between the first inner trench 31a and the second inner trench 31b, and $T_{OXI}1$ represents the thickness of the insulating film 41, $W_{SBD}/T_{OXI}1 \leq 5.5$ may hold. The $W_{SBD}$ may be referred to as the width of the N⁻-type semiconductor between the first inner trench 31a and the second inner trench 31b. When $T_{OXI}3$ represents the thickness of the insulating film 43, $W_{SBD}/T_{OXI}3 \leq 5.5$ may hold. With these relationships, the Schottky barrier diode 1 obtains desired pressure resistance.

The perimeter trench 33 and the first inner trench 31a extend parallel to one another. When $W_{E\text{-}SBD}$ represents the distance between the perimeter trench 33 and the inner trench 31a, $W_{E\text{-}SBD} \leq W_{SBD}$ may hold. The $W_{E\text{-}SBD}$ may be referred to as the width of the N⁻-type semiconductor between the perimeter trench 33 and the inner trench 31a. With this relationship, the Schottky barrier diode 1 obtains desired pressure resistance.

When $W_{trench}1$ represents the width of the first inner trench 31a, and $W_{E\text{-}trench}$ represents the width of the perimeter trench 33, $W_{trench}1 \leq W_{E\text{-}trench}$ may hold. When $W_{trench}2$ represents the width of the second inner trench 31b, and $W_{E\text{-}trench}$ represents the width of the perimeter trench 33, $W_{trench}2 \leq W_{E\text{-}trench}$ may hold. With these relationships, the Schottky barrier diode 1 obtains desired pressure resistance.

In the embodiment, dimensions, such as the depth and the width, of each of various trenches are shown. The trenches shown herein each contain an inner field electrode and an insulating film. That is, the depth thereof is a direct distance from the second surface S2 to the point closest to the semiconductor substrate 12 on the insulating film in the trench, and the width thereof is determined on the basis of the outer edge of the insulating film. In the drawings, the perimeter trench is shown as the outermost trench, but another trench may be disposed closer to the outer perimeter side of the semiconductor layer than the perimeter trench.

In the embodiment, as the semiconductor device according to the present disclosure, the Schottky barrier diode 1 is described as an example. However, the semiconductor device according to the present disclosure may be a diode, a transistor or the like having a trench structure at the outer perimeter portion of a semiconductor layer. The Schottky barrier diode 1 of the embodiment or the semiconductor device according to the present disclosure may be provided to various electric devices. Examples of the electric devices include a power module having a power supply circuit that performs power conversion. Examples of the electric devices also include various electronic devices, trains and automobiles.

The description of the embodiment is illustrative in every aspect, and hence the present invention is not limited thereto. The present disclosure is applicable to the embodiment subjected to appropriate combination, change, replacement, addition, omission and/or the like of the aspect(s) as far as there is no inconsistency. It is appreciated that not-shown numerous modifications can be envisaged without departing from the scope of the present invention.

INDUSTRIAL APPLICABILITY

The present invention is applicable to a semiconductor device and an electric device.

REFERENCE SIGNS LIST

1 Schottky Barrier Diode (Semiconductor Device)
11 Semiconductor Layer
12 Semiconductor Substrate
13 Epitaxial Layer
21 First Electrode
22 Second Electrode
22E Outer Perimeter End of Second Electrode
31a Inner Trench (First Trench)
31b Inner Trench (Third Trench)
33 Perimeter Trench (Second Trench)
51a, 51b, 51c Rectifier Area
53 Pressure-resistant Area
S1 First Surface
S2 Second Surface
23 Inner Field Electrode (Third Electrode)
24 Inner Field Electrode (Fourth Electrode)
25 Inner Field Electrode (Fifth Electrode)
41 Insulating Film (First Insulating Film)
42 Insulating Film (Second Insulating Film)
43 Insulating Film (Third Insulating Film)

The invention claimed is:

1. A semiconductor device comprising:
a first layer having a first semiconductor containing an impurity of a first conductivity type;
a second layer being in contact with the first layer and having a second semiconductor containing the impurity of the first conductivity type at a lower concentration than the first semiconductor;
a first electrode being in contact with a first surface of the first layer opposite the second layer; and
a second electrode being in contact with a second surface of the second layer opposite the first layer,
wherein the second layer further has:
a first trench having therein a third electrode connected to the second electrode; and
a second trench located closer to an outer perimeter portion of the second layer than the first trench and having therein a fourth electrode connected to the second electrode, and
wherein the second electrode is in contact with the second surface between the first trench and the second trench and an outer perimeter end of the second electrode, the outer perimeter end being perpendicular to the second surface, and is in contact with the fourth electrode.

2. The semiconductor device according to claim 1, wherein the first conductivity type is a P-type.

3. The semiconductor device according to claim 1, wherein the first conductivity type is an N-type.

4. The semiconductor device according to claim 1, wherein a difference between a depth of the first trench and a depth of the second trench is less than 10% of the depth of the first trench.

5. The semiconductor device according to claim 4, wherein a relationship between a thickness $E_{pit}$ of the second layer and the depth represented by $TRE_D$ of the first trench or the depth represented by $TRE_D2$ of the second trench is $0.30 \times E_{pit} \leq TRE_D$ or $TRE_D2 \leq 0.80 \times E_{pit}$.

6. The semiconductor device according to claim 1,
wherein the second layer further has a third trench located farther from the outer perimeter portion of the second layer than the first trench and having therein a fifth electrode connected to the second electrode,
wherein the first trench further has therein a first insulating film interposed between the second semiconductor and the third electrode,
wherein the second trench further has therein a second insulating film interposed between the second semiconductor and the fourth electrode,
wherein the third trench further has therein a third insulating film interposed between the second semiconductor and the fifth electrode,
wherein a relationship between a thickness $T_{OXI}1$ of the first insulating film and a width $W_{SBD}$ of the second semiconductor interposed between the first trench and the third trench is $W_{SBD}/T_{OXI}1 \leq 5.5$, and
wherein a relationship between a thickness $T_{OXI}3$ of the third insulating film and the width $W_{SBD}$ is $W_{SBD}/T_{OXI}3 \leq 5.5$.

7. The semiconductor device according to claim 6, wherein a relationship between a width $W_{E\text{-}SBD}$ of the second semiconductor interposed between the first trench and the second trench and the width $W_{SBD}$ is $W_{E\text{-}SBD} \leq W_{SBD}$.

8. The semiconductor device according to claim 7, wherein a relationship between a width $W_{trench}1$ of the first trench and a width $W_{E\text{-}trench}$ of the second trench is $W_{trench}1 \leq W_{E\text{-}trench}$, and
wherein a relationship between a width $W_{trench}2$ of the third trench and the width $W_{E\text{-}trench}$ of the second trench is $W_{trench}2 \leq W_{E\text{-}trench}$.

9. The semiconductor device according to claim 1, wherein the second surface is flat at least from an end of the first trench on a side far from the second trench to an end of the fourth electrode on a side close to the outer perimeter portion of the second layer.

10. An electric device comprising a semiconductor device comprising:
- a first layer having a first semiconductor containing an impurity of a first conductivity type;
- a second layer being in contact with the first layer and having a second semiconductor containing the impurity of the first conductivity type at a lower concentration than the first semiconductor;
- a first electrode being in contact with a first surface of the first layer opposite the second layer; and
- a second electrode being in contact with a second surface of the second layer opposite the first layer,
wherein the second layer further has:
- a first trench having therein a third electrode connected to the second electrode; and
- a second trench located closer to an outer perimeter portion of the second layer than the first trench and having therein a fourth electrode connected to the second electrode, and
wherein the second electrode is in contact with the second surface between the first trench and the second trench and an outer Perimeter end of the second electrode, the outer perimeter end being perpendicular to the second surface, and is in contact with the fourth electrode.

11. The semiconductor device according to claim 1, wherein the second trench is deeper than the first trench.

12. The semiconductor device according to claim 1, wherein
the second trench further has therein a second insulating film interposed between the second semiconductor and the fourth electrode,
the second insulating film extends past the second surface, and
the fourth electrode extends past the second surface.

* * * * *